United States Patent [19]

Tien

[11] Patent Number: 5,777,209
[45] Date of Patent: Jul. 7, 1998

[54] LEAKAGE DETECTION APPARATUS EQUIPPED WITH UNIVERSAL ADAPTER HEAD AND METHOD OF TESTING

[75] Inventor: Fu-Kang Tien, Hsin-chu, Taiwan

[73] Assignee: Taiwan Semiconductor Manufacturing Company, Ltd., Hsin-Chu, Taiwan

[21] Appl. No.: 764,197

[22] Filed: Dec. 13, 1996

[51] Int. Cl.⁶ .............................. G01M 3/04; G01M 3/20; B05D 3/00
[52] U.S. Cl. .............................. 73/40.7; 73/49.8; 73/865.9
[58] Field of Search .............................. 73/40.7, 49.8, 73/49.3, 865.9

[56] References Cited

U.S. PATENT DOCUMENTS

| 4,432,227 | 2/1984 | Dunn | 73/49.8 |
|---|---|---|---|
| 4,553,435 | 11/1985 | Goldfarb et al. | 73/40.7 |
| 4,791,806 | 12/1988 | Wade | 73/40.7 |
| 4,813,268 | 3/1989 | Helvey | 73/40.7 |
| 4,984,450 | 1/1991 | Bürger | 73/40.7 |
| 5,168,747 | 12/1992 | Weaver et al. | 73/40.7 |
| 5,172,583 | 12/1992 | Tallon | 73/40.7 |
| 5,317,900 | 6/1994 | Bergquist | 73/40.7 |
| 5,398,543 | 3/1995 | Fukushima et al. | 73/40.7 |
| 5,537,857 | 7/1996 | Grossebley | 73/40.7 |
| 5,614,249 | 3/1997 | Mayeda | 427/8 |

Primary Examiner—Hezron E. Williams
Assistant Examiner—J. David Wiggins
Attorney, Agent, or Firm—Barnes,Kisselle, Raisch, Choate, Whittemore &Hulbert, P.C.

[57] ABSTRACT

The present invention discloses a leakage detection apparatus for testing the vacuum tightness of a semiconductor processing equipment which is equipped with a universal adapter head for testing various components of the equipment and a method for conducting such tests. Valuable down time can be saved on the semiconductor fabrication equipment by pre-screening all components on the basis of vacuum tightness testing done by a leak detection chamber supplied with such universal adapter head before they are assembled into the fabrication equipment after a maintenance or cleaning procedure is conducted on the components.

17 Claims, 1 Drawing Sheet

LEAKAGE DETECTION APPARATUS EQUIPPED WITH UNIVERSAL ADAPTER HEAD AND METHOD OF TESTING

FIELD OF THE INVENTION

The present invention generally relates to a leakage detection apparatus for use with a semiconductor processing equipment and a method of conducting such tests and more particularly, relate to a leakage detection apparatus for testing the vacuum tightness of a semiconductor processing equipment which is equipped with a universal adapter head for testing various components of the equipment and a method of conducting such tests.

BACKGROUND OF THE INVENTION

Ion implantation method has been used for placing impurity, or doping, ions in a semiconductor material such as a silicon substrate at precisely controlled depths and at accurately controlled dopant concentrations. One of the major benefits of the ion implantation method is its capability to precisely place ions at preselected locations and at predetermined dosage. It is a very reproducible process that enables a high level of dopant uniformity. For instance, a typical variation of less than 1% can be obtained across a wafer.

An ion implanter operates by providing an ion source wherein collisions of electrons and neutral atoms result in a large number of various ions being produced. The ions required for doping are then selected out by an analyzing magnet and sent through an acceleration tube. The accelerated ions are then bombarded directly onto the portion of a silicon wafer where doping is required. The bombardment of the ion beam is usually conducted by scanning the beam or by rotating the wafer in order to achieve uniformity. A heavy layer of silicon dioxide or a heavy coating of a positive photoresist image is used as the implantation mask. The depth of the dopant ions implanted is dictated by the energy possessed by the dopant ions, which is normally adjustable by changing the acceleration chamber voltage. The dosage level of the implantation, i.e., the number of dopant ions that enters into the wafer, is determined by monitoring the number of ions passing through a detector. As a result, a precise control of the junction depth planted in a silicon substrate can be achieved by adjusting the implantation energy, while a precise control of the dopant concentration can be achieved by adjusting the dosage level.

Ion implantation machines can be classified with respect to their acceleration voltage as either a low-energy machine ($\leq 20$ keV), a medium-energy machine (20~400 keV) or a high-energy machine (400 keV~3 MeV). The energy level required normally depends on the desired penetration depth of the ions implanted. A schematic of a typical ion implanter 10 is shown in FIG. 1.

The major components of the ion implanter 10 shown in FIG. 1 are the ion source head 12, the analyzer magnet (or a source can) 14, a resolving aperture 16, an acceleration column (or acceleration electrode) 20, an ion beam focus 22, a neutral beam trap and beam gate 24, Y-scan plates 26 and X-scan plates 28, a beam trap and gate plate 32, and a wafer 36 positioned in a process chamber. The design of an ion implanter and its components normally depends on the desired performance of the implanter and its specific doping requirements, for instance, the implanted flux, the beam current and the power density. The purpose of the ion source head 12 is to produce and maintain a high-density of ions in a vacuum chamber with suitable geometry such that a focused beam of ions can be extracted from the ion source head and transported through the various components of the implanter to the target. Impurity ions such as arsenic and phosphorus can be introduced from a solid or gaseous source into the chamber. The initial beam 38 then passes through an analyzer magnet 14 before it is accelerated by the acceleration column 20. The analyzer magnet 14 is positioned directly normal to the strong magnetic field that separates the ions according to their mass to charge ratio. The acceleration column 20 can be selected depending on the type of acceleration voltage desired as a low-energy, a medium-energy or a high-energy implanter.

Most of the ion acceleration occurs after the beam 38 leaves the analyzer magnet 14. The analyzer output beam 42 is then focused by the resolving aperture 16 and directed, into a field of the accelerating column 20 where the ions gain the necessary kinetic energy. For instance, a final ion energy of 200 keV can be achieved by using a beam started with an extraction potential of 40 keV and an acceleration of 160 keV. The accelerated beam then passes through a focus 22, a neutral beam trap and beam gate 24 and enters into a scanning system of Y-scan plates 26 and X-scan plates 28. Since an ion beam is typically between 2~5 cm in diameter, the beam can be swept both in the vertical and in the horizontal direction across the wafer in order to distribute the dopants homogeneously over the surface of the wafer. This scanning is normally conducted by using electrostatic deflection plates (i.e., the Y-scan plates 26 and the X-scan plates 28). The electrostatic scan frequency normally utilized is between about 1~2 kHz. For implanter 10 to function properly, a vacuum of at least $10^6$ Torr must be provided by the vacuum system 18.

Other important components are also used in an ion implanter such as a Faraday cage (not shown) which surrounds the target and has an opening facing a low-energy aperture maintained at a small positive voltage. The Faraday cage collects secondary electrons that are emitted from the target by the incoming ions and then returns them to the integrating circuit. This insures the accuracy in the dosage measurement. Another important component of a high-power ion implanter is the electron shower (not shown) such as that used in an Eaton NV 10 ion implanter. The electron shower reduces charge accumulation on an insulating surface of the wafer by neutralizing an ion beam with excess electrons at the wafer surface. An efficient neutralization can be achieved by immersing the wafer in a "shower" of low-energy electrons or secondary electrons. This eliminates the possibility of damaging the insulator on the wafer by means of negative ions built-up. When a wafer is implanted inside a Faraday cage, the electron shower is normally mounted inside the cage such that electrons cannot escape and cause a dosage error.

As described above, an ion implanter of either the medium-energy type or the high-energy type requires a number of important components to successfully implant impurity ions into the surface of a wafer. These major components are the current source head, the current source can (the analyzer magnet), the current extraction electrode, the current acceleration column (or electrode), the current electron shower and the current Faraday cage. These components must operate under high vacuum environment and therefore, the vacuum tightness of each component is critical.

Periodically, the major components require maintenance or cleaning on a regular basis. Since the wafer surface can not be contaminated other than by the intended impurity ions, no contamination in the ion implanter components can be tolerated. It is therefore a routine maintenance procedure that the components not only must be disassembled for repairs or tuning to the specification, but also must be thoroughly cleaned. This can be conducted on either daily, weekly or monthly basis depending on the nature of the component and the usage of the machine. After each cleaning or maintenance work is conducted on the components, they are normally reassembled together and the system tested for proper operation. In the event that one or more of the components is proven to be malfunctioning, the entire system must be shut down such that repairs or adjustments can be made to the components. One of the frequently occurring problems is the leakage or the lack of vacuum tightness of the components which renders the achievement of an operating vacuum on the machine, i.e. in the range of approximately $10^{-6}$ Torr impossible. When one of the components has the leakage problem, the entire system must be shut down and valuable fabrication time is lost on the machine. It is therefore desirable to provide a method and apparatus such that each major component can be tested for leakage or vacuum tightness prior to being assembled into the system.

It is therefore an object of the present invention to provide an apparatus and method for testing major components of a semiconductor processing machine after a repair or cleaning procedure that does not have the drawbacks or shortcomings of conventional apparatus and method.

It is another object of the present invention to provide an apparatus and a method for testing major components of a semiconductor processing equipment for leakage or vacuum tightness after a maintenance or cleaning procedure prior to the reassembly of the equipment such that down time of the processing equipment can be avoided.

It is a further object of the present invention to provide an apparatus and a method for testing components of an ion implanter after a maintenance or cleaning procedure on the component is conducted and prior to the reassembly of the implanter by utilizing a leakage detection system wherein all components can be tested for leakage prior to the reassembly process.

It is still another object of the present invention to provide an apparatus and a method for testing major components of an ion implanter after such components are maintained or cleaned and before they are reassembled into the implanter by utilizing a leakage detection system equipped with a detection chamber adapted for receiving all the components.

It is yet another object of the present invention to provide an apparatus and a method for testing major components of an ion implanter after such components are repaired or cleaned and before they are reassembled together by utilizing a leakage detection system equipped with a detection chamber and a plurality of mounting plates adapted for receiving all major components for leakage testing.

SUMMARY OF THE INVENTION

In accordance with the present invention, a leakage detection apparatus for use with a semiconductor processing equipment and a method of conducting such tests are provided.

In a preferred embodiment, a leakage detection apparatus for testing components of a semiconductor processing equipment for vacuum tightness is provided which includes a leakage detection chamber that is generally formed of a cylindrical shape having two ends connected by a sidewall wherein the first end is sealed and the second end is opened and is equipped with a flange having a predetermined dimension adapted for receiving a plurality of mounting plates, a plurality of mounting plates each having substantially the same outside dimension for fitting snugly on the flange and a cavity of different shapes and dimensions, each of the mounting plates is adapted for mounting a component in the semiconductor processing equipment such that the vacuum tightness of the component can be tested, and a first and a second port opened in the cylindrical sidewall of the leakage detection chamber, the first port is in fluid communication with a vacuum pump and a helium detector while the second port is in fluid communication with a vacuum gauge.

The present invention is also directed to a leakage detection system for testing components in an ion implanter for vacuum tightness which includes a leakage detection chamber that is equipped with an open top and two ports in a sidewall of the chamber, a flange in the open top of the chamber adapted for receiving a plurality of mounting plates, a plurality of mounting plates each having an outside dimension for fitting intimately with the flange and an inside cavity for fitting intimately and establishing fluid communication with a component of the ion implanter, a vacuum pump and a helium detector connected in parallel to one port on the chamber, and a vacuum gauge connected to the other port on the chamber.

The present invention is further directed to a method of testing components in a semiconductor processing machine for vacuum tightness by the operating steps of first providing a leakage detection chamber that is equipped with an open top and a flange opening adapted for receiving one of a plurality of mounting plates, the chamber is further equipped with at least two ports for connection to a vacuum pump, a helium detector and to a vacuum gauge respectively, and then positioning a mounting plate selected from the plurality of mounting plates on the flange opening, and mounting a component of the semiconductor processing machine to the mounting plate such that fluid communication can be established between the component and the detection chamber through a cavity in the mounting plate, and then evacuating the leakage detection chamber by the vacuum pump, and dispensing helium gas at or near the mounted component on the exterior surface portion and reading helium concentration on the helium detector.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED EMBODIMENT

The present invention provides a leakage detection apparatus for testing the vacuum tightness of a semiconductor processing equipment which is equipped with a universal adapter head for testing various components of the equipment and a method of conducting such tests. The specific semiconductor processing equipment illustrated is an ion implanter. However, the general principal of the present invention leakage detection chamber equipped with a universal adapter head is applicable to any other semiconductor processing equipment, as long as a test on the vacuum tightness of a certain component after repair or cleaning is desired.

Figure 1:
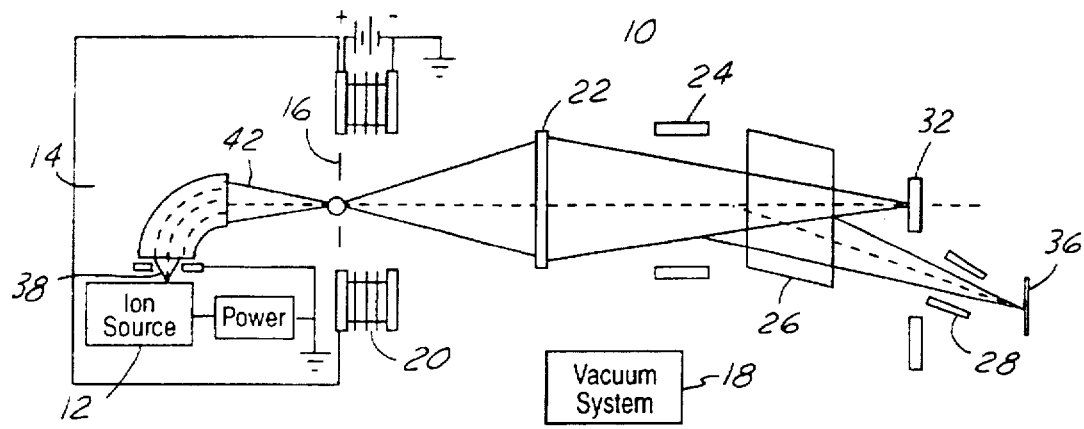
FIG. 1 is a schematic showing the major component of a typical ion implanter.

To illustrate the present invention apparatus and method, an ion implanter shown in FIG. 1 is conveniently used as an example. As shown in FIG. 1, the major components of the ion implanter 10 which are subjected to periodic maintenance requirement for repair or cleaning include the ion source head 12, the source can 14, the acceleration electrode 20, the extraction electrode (not shown), the electron shower and the Faraday cage. Most of these components require pre-scheduled routine maintenance or cleaning procedures to be carried out on daily, weekly or monthly basis depending on the usage and the condition of the equipment. After the components are disassembled from the ion implanter 10, they are cleaned or subjected to various repair or maintenance procedures. After such cleaning or repair procedure, the components are first tested for their vacuum tightness and any possible vacuum leakage before they are assembled back into the system. This saves substantial amount of down time since defective components can be detected prior to the reassembly and can be replaced by a working component.

In a typical ion implanter, a vacuum of $10^{-6}$ Torr is desirable for conducting an ion implantation process. For a properly sealed ion implanter, the vacuum achieved can be as high as $10^{-6}$ or $10^{-7}$ Torr. However, when any of the components has a leakage problem, the vacuum can be reduced to $10^{-5}$ or $10^{-4}$ Torr which renders the proper operation of the ion implanter impossible.

Figure 2:
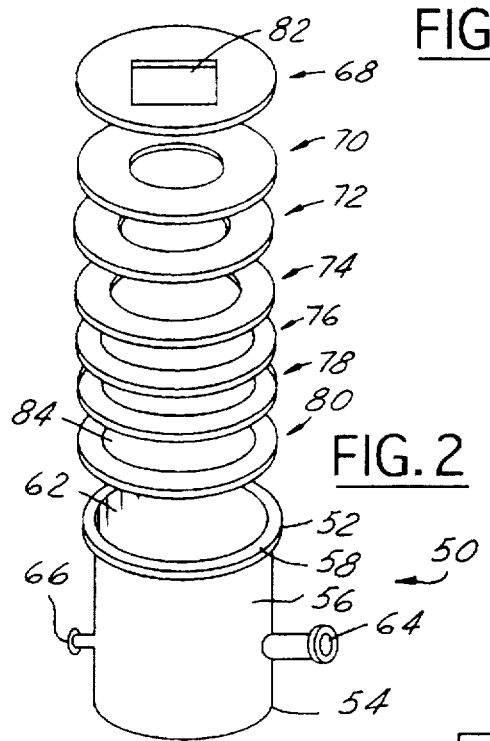
FIG. 2 is a perspective view of the present invention leakage detection chamber and the plurality of mounting plates for testing various components.

A present invention novel leakage detection chamber 50 is shown in FIG. 2. The chamber 50 is equipped with two ends 52 and 54 connected by a cylindrical sidewall 56. The end 54 is closed while the end 52 is opened and equipped with a flange 58. The chamber 50 has a cavity 62 which is in fluid communication with ports 64 and 66. A plurality of mounting plates 68, 70, 72, 74, 76, 78 and 80 are provided each having an outside diameter substantially equal to that of flange 58 on chamber 50. The plurality of mounting plates each having an inside cavity that is of a different dimension and/or shape. For instance, mounting plate 68 is equipped with a small square cavity 82 in the center of the plate while mounting plate 80 is equipped with a large circular cavity 84 in the center of the plate. The size and shape of the cavities in mounting plates 68–80 are designed specifically to fit the openings (not shown) of the components in the ion implanter 10. For instance, mounting plate 68–80 may be designed to fit the source can, the source head, the extraction electrode, the acceleration electrode, the electron shower and the Faraday cage of the ion implantation machine.

It should be noted that the same leakage detection chamber 50 can be adapted to fit several ion implantation machines. For instance, a medium-current machine and a high-current machine. It should also be noted that the present invention novel leakage detection chamber 50 and the leakage detection system 90 shown in FIG. 3 can be adapted to fit an unlimited number of components from any semiconductor processing machine. The leakage detection chamber 50 can be used for testing any component as long as a suitable mounting plate can be provided for such component. A suitable mounting plate should have an outside dimension substantially the same as that of the flange 58 and an internal cavity of any size or shape for fitting to the specific component to be tested.

Figure 3:
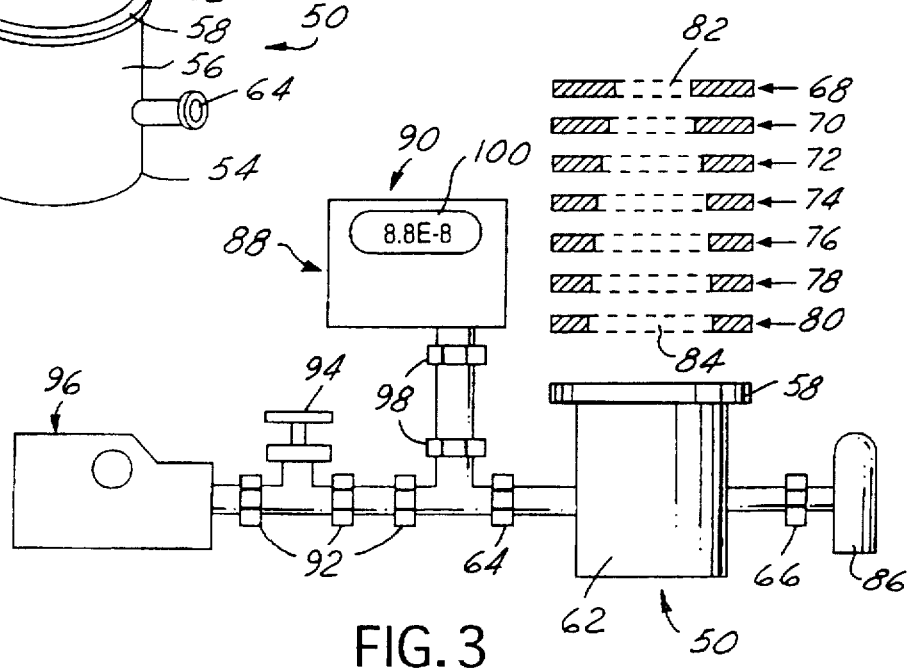
FIG. 3 is a schematic showing the present invention leakage detection system including the leakage detection chamber, a vacuum pump, a helium detector and a vacuum gauge.

A present invention leakage detection system 90 is shown in FIG. 3. The leakage detection chamber 50 is connected to a vacuum gauge 86 through port 66 such that the initial vacuum condition of the chamber cavity 62 can be monitored. The vacuum gauge 86 used is capable of monitoring a pressure between 1 Atm and $10^{-3}$ Torr. The plurality of mounting plates 68–80 are shown in their cross-sectional views illustrating, for example, cavity 82 for mounting plate 68 and cavity 84 for mounting plate 80. The external dimension of all mounting plates is substantially the same as the external dimension of flange 58 on chamber 50. Chamber 50 is also connected to vacuum pump 96 and helium detector 88 through port 64. A series of quick-disconnect valves 92 is used between the vacuum pump 96 and port 64. Other quick-disconnect valves 98 are used in connecting the helium detector 88 and the port 64. A manual shut-off valve 94 is provided between the quick-disconnect valves 92 such that vacuum pump 96 can be disconnected and isolated from the leakage detection chamber 50. The vacuum pump 96 normally consists of a mechanical pump that is capable of reducing the chamber pressure to $10^{-3}$ Torr. A turbo pump may also be provided which is capable of further reducing the chamber pressure to $10^{-8}$ Torr.

The helium detector 88 used in the leakage detection system 90 is a widely used, reliable and high sensitivity leakage detector. It provides stable readings and a fast response time. The helium gas detected is not easily affected by other gases due to its inert nature. A helium leakage detector 88 can be constructed of a simple mass spectrometer which operates by the principal that it first ionizes gases detected in the vacuum system into ions, and then analyzes the ions based on their different mass to charge ratios in order to determine the content of the ions in the system. The helium gas is selected for its inertness, its low specific gravity and its capability of penetrating minute cracks and crevices in the component of a semiconductor processing component. The helium gas can be easily detected by the mass spectrometer since it is easily separable from other gases having a similar mass. Other advantages of using the helium gas is the minute content that it is present in the atmosphere, i.e., 5 ppm, its low cost and its inertness and non-toxicity.

The present invention novel method of testing components in a semiconductor processing machine for vacuum tightness can now be described according to FIG. 3. After a component to be tested (not shown) is mounted to flange 58 of chamber 50 through any one of the mounting plates 68–80, a rough-in leak detection vacuum in chamber 62 is provided by the mechanical pump in the vacuum system 96. The rough-in vacuum achieved is approximately between $10^{-2}$ and $10^{-3}$ Torr. After the desirable rough-in vacuum is read on vacuum gauge 86, the manual shut-off valve 94 is closed to isolate the vacuum system 96 from the detection chamber 50. A turbo pump and a foreline pump which is normally attached to the helium leakage detector 88 is then activated to further reduce the pressure in chamber 62 to a high vacuum of between $10^{-7}$ and $10^8$ Torr. A stream of helium gas is then sprayed from a spray gun (not shown) onto the component (not shown) being tested for a suitable period of time, i.e., between about 10 seconds and about 30 seconds. The numerical reading at gauge 100 of helium concentration is monitored during the helium spray to detect any change that signifies a leakage in the component. For instance, a helium concentration of $5 \times 10^{-7}$ is normally read on the helium detector 88 when there is no leakage, while a reading of $>10^{-5}$ is read when there is a substantial leakage in the component.

The present invention method and apparatus of a leakage detection system for testing vacuum tightness of a semiconductor processing equipment is amply exemplified by the preceding descriptions. It should be noted that, while in the preferred embodiment an ion implantation machine is used as an example and its components are tested for vacuum tightness, the applicability of the present invention method and apparatus is not limited to the testing of an ion implantation equipment and its components. Any other semiconductor processing equipment which has components operating under a high vacuum condition can be tested by the present invention novel apparatus and method.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

The invention claimed is:

1. A leakage detection apparatus for testing components of a semiconductor processing equipment for vacuum tightness comprising:
    a leakage detection chamber generally of a drum shape having two ends connected by a cylindrical sidewall wherein the first end is sealed and the second end is open and is equipped with a flange having a predetermined dimension adapted for receiving any one of a plurality of mounting plates,
    a plurality of mounting plates each having substantially the same outside dimension and shape as said flange for fitting snugly on top of said flange and-a-cavity of different shapes and dimensions, each of said mounting plates is adapted for mounting a component in said semiconductor processing equipment such that the vacuum tightness of the component used can be tested, and
    a first and a second port opened in said cylindrical sidewall of said leakage detection chamber, said first port is in fluid communication with a vacuum pump and a helium detector while said second port is in fluid communication with a vacuum gauge.

2. An apparatus according to claim 1, further comprising valve means positioned between said vacuum pump and said helium detector such that only the helium detector may optionally be connected in fluid communication with said leakage detection chamber.

3. A leakage detection apparatus for testing components of a semiconductor processing equipment of an ion implanter for vacuum tightness comprising:
    a leakage detection chamber generally of a drum shape having two ends connected by a cylindrical sidewall wherein the first end is sealed and the second end is open and is equipped with a flange having a predetermined dimension adapted for receiving a plurality of mounting plates,
    a plurality of mounting plates each having substantially the same outside dimension for fitting snugly on top of said flange and a cavity of different shapes and dimensions, each of said mounting plates is adapted for mounting a component in said semiconductor processing equipment such that the vacuum tightness of the component can be tested, and
    a first and a second port opened in said cylindrical sidewall of said leakage detection chamber, said first port is in fluid communication with a vacuum pump and a helium detector while said second port is in fluid communication with a vacuum gauge.

4. An apparatus according to claim 3, wherein said component used in an ion implanter is selected from the group consisting of a source can, a source head, an extraction electrode, an acceleration electrode, an electron shower and a Faraday cage.

5. An apparatus according to claim 1, wherein said flange at the open end of the leakage detection chamber is of a circular shape.

6. An apparatus according to claim 1, wherein said cavity in said mounting plates is either of a circular shape or of a rectangular shape.

7. An apparatus according to claim 1, wherein said flange further comprising a flexible gasket for making intimate contact with said mounting plate.

8. An apparatus according to claim 1, wherein said apparatus is capable of testing components in an ion implanter for vacuum tightness to at least $10^{-5}$ Torr.

9. A leakage detection system for testing components in an ion implanter for vacuum tightness comprising:
    a leakage detection chamber equipped with an open top and two ports in a sidewall of the chamber,
    a flange in said open top of the chamber adapted for receiving a plurality of mounting plates,
    a plurality of mounting plates each having an outside dimension and shape designed for fitting intimately with said flange and an inside cavity for fitting intimately and establishing a fluid communication with a component of said ion implanter, and
    a vacuum pump and a helium detector connected in parallel to one port on said chamber, a vacuum gauge-connected to the other port on said chamber.

10. A leakage detection system for testing components in an ion implanter for vacuum tightness comprising:
    a leakage detection chamber equipped with an open top and two ports in a sidewall of the chamber,
    a flange in said open top of the chamber adapted for receiving a plurality of mounting plates,
    a plurality of mounting plates each having an outside dimension for fitting intimately with said flange and an inside cavity for fitting intimately and establishing a fluid communication with a component of said ion implanter, said component is selected from the group consisting of a source can, a source head, an extraction electrode, an acceleration electrode, an electron shower and a Faraday cage, and
    a vacuum pump and a helium detector connected in parallel to one port on said chamber, a vacuum gauge connected to the other port on said chamber.

11. A system according to claim 9, further comprising valve means positioned between said vacuum pump and said helium detector such that only said helium detector may optionally be connected to said leakage detection chamber.

12. A system according to claim 9, further comprising a flexible gasket positioned in said flange for providing intimate contact with said mounting plate.

13. A method of testing components in a semiconductor processing machine for vacuum tightness comprising the steps of:
    providing a leakage detection chamber equipped with an open top and a flange opening adapted for receiving one of a plurality of mounting plates, said chamber further equipped with at least two ports for connection to a vacuum pump, a helium detector and to a vacuum gauge, respectively, positioning a mounting plate selected from said plurality of mounting plates on said flange opening, mounting a component of said semiconductor processing machine to said mounting plate such that fluid communication is established between said component and said detection chamber through a cavity in said mounting plate, evacuating said leakage detection chamber by said vacuum pump, dispersing helium gas at or near the surface on an exterior portion of said mounted component and reading helium concentration on said helium detector.

14. A method according to claim 13, wherein said cavity in the mounting plate has a shape and dimension specifically designed to fit one specific component.

15. A method of testing components in a semiconductor processing machine for vacuum tightness comprising the steps of:

providing a leakage detection chamber equipped with an open top and a flange opening adapted for receiving one of a plurality of mounting plates, said chamber further equipped with at least two ports for connection to a vacuum pump, a helium detector and to a vacuum gauge, respectively, positioning a mounting plate selected from said plurality of mounting plates on said flange opening, mounting a component of said semiconductor processing machine to said mounting plate such that fluid communication is established between said component and said detection chamber through a cavity in said mounting plate said component is selected from the group consisting of a source can, a source head, an extraction electrode, an acceleration electrode, an electron shower and a Faraday cage, evacuating said leakage detection chamber by said vacuum pump, dispersing helium gas at or near said mounted component and reading helium concentration on said helium detector.

16. A method according to claim 13, further comprising the step of closing a valve between said vacuum pump and said detection chamber after the chamber is evacuated such that only the helium detector is in fluid communication with the detection chamber.

17. A method according to claim 13, further comprising the step of positioning a flexible gasket on said mounting plate such that intimate contact between said component and said detection chamber can be established.

* * * * *